United States Patent
Li et al.

(10) Patent No.: US 6,740,248 B2
(45) Date of Patent: May 25, 2004

(54) METHOD FOR ETCHING DIELECTRIC FILMS

(75) Inventors: Li Li, Meridian, ID (US); Don L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/327,375

(22) Filed: Dec. 20, 2002

(65) Prior Publication Data

US 2003/0121884 A1 Jul. 3, 2003

Related U.S. Application Data

(63) Continuation of application No. 09/518,292, filed on Mar. 3, 2000, now Pat. No. 6,497,827, which is a continuation of application No. 09/055,644, filed on Apr. 6, 1998, now Pat. No. 6,117,351.

(51) Int. Cl.⁷ ............................ C23F 1/00; H01L 21/302
(52) U.S. Cl. ........................ 216/99; 216/95; 438/756; 438/757; 252/79.1
(58) Field of Search ................ 216/95, 99; 438/756, 438/757; 252/79.1

(56) References Cited

U.S. PATENT DOCUMENTS

| | | |
|---|---|---|
| 3,657,030 A | 4/1972 | Porter |
| 3,709,749 A | 1/1973 | Sato et al. |
| 3,859,222 A | 1/1975 | Squillace et al. |
| 4,092,211 A | 5/1978 | Morris |
| 4,980,017 A | 12/1990 | Kaji et al. |
| 5,641,383 A * | 6/1997 | Jun ........................ 438/695 |
| 5,716,884 A | 2/1998 | Hsue et al. |
| 5,930,650 A | 7/1999 | Chung et al. |
| 5,933,739 A * | 8/1999 | Lin ........................ 438/301 |
| 6,087,273 A | 7/2000 | Torek et al. |
| 6,117,351 A | 9/2000 | Li et al. |

OTHER PUBLICATIONS

W. van Gelder, et al., Journal of the Electrochemical Society: Solid State Science, vol. 114, No. 8, pp. 869–872, Aug. 1967.

K. Sato, et al., Detailed Study of Silicon–Nitride–Etching Mechanism by Phosphoric Acid for Advanced ULSI Processing (Abstract), Tohoku University—date unknown.

* cited by examiner

Primary Examiner—Robert Kunemund
Assistant Examiner—Shamim Ahmed
(74) Attorney, Agent, or Firm—TraskBritt

(57) ABSTRACT

A method for removing a plurality of dielectric films from a supporting substrate by providing a substrate with a second dielectric layer overlying a first dielectric layer, contacting the substrate at a first temperature with a first acid solution exhibiting a positive etch selectivity at the first temperature, and then contacting the substrate at a second temperature with a second acid solution exhibiting a positive etch selectivity at the second temperature. The first and second dielectric layers exhibit different etch rates in the first and second acid solutions. The first and second acid solutions may contain phosphoric acid. The first dielectric layer may be silicon nitride and the second dielectric layer may be silicon oxide. Under these conditions, the first temperature may be about 175° C. and the second temperature may be about 155° C.

26 Claims, 3 Drawing Sheets

METHOD FOR ETCHING DIELECTRIC FILMS

CROSS-REFERENCE TO RELATED APPLICATIONS

This application is a continuation of application Ser. No. 09/518,292, filed Mar. 3, 2000, now U.S. Pat. No. 6,497,827, issued Dec. 24, 2002, which is a continuation of application Ser. No. 09/055,644, filed Apr. 6, 1998, now U.S. Pat. No. 6,117,351, issued Sep. 12, 2000.

BACKGROUND OF THE INVENTION

1. Field of the Invention

This invention relates generally to the field of semiconductor design and fabrication. Specifically, the invention relates to methods for removing dielectric layers from integrated circuit devices.

2. State of the Art

During manufacture of integrated circuit (IC) devices, dielectric layers are often used to aid the fabrication process. For example, to protect active areas of a silicon substrate during formation of oxide isolation regions (e.g., field oxide regions), a silicon nitride layer will be formed over the active areas of the substrate. While forming the oxide isolation regions, the surface of the silicon nitride layer becomes oxidized. After aiding the fabrication process, the oxidized silicon nitride layer must be removed.

Several processes are known to remove oxidized silicon nitride layers from IC devices. In one removal process, described in U.S. Pat. No. 3,709,749 and incorporated herein by reference, a substrate containing the oxidized silicon nitride layer is dipped in high-temperature (100° C.) water. Other removal processes use phosphoric acid ($H_3PO_4$). See, for example, W. van Gelder et al., *Journal of the Electrochemical Society: SOLID STATE SCIENCE*, Vol. 114, No.8, pp. 869–872 (August 1967), U.S. Pat. No. 4,092,211, and K. Sato et al., *Detailed Study of Silicon-Nitride-Etching Mechanism by Phosphoric Acid for Advanced ULSI Processing* (Abstract), Tohoku University (date unknown), the disclosures of which are incorporated herein by reference. At low temperatures, phosphoric acid is unable to significantly etch the silicon nitride because of its inability to appreciably attack the silicon oxide. Higher temperatures speed up the attack of the silicon oxide, but decrease the etch rate of the silicon nitride. As a result, it has been difficult to etch an oxidized silicon nitride structure using In an attempt to increase the etch rate of silicon oxide at low temperatures, fluoroboric acid has been combined with phosphoric acid as described in U.S. Pat. No. 3,859,222, incorporated herein by reference. But adding fluoroboric acid has not significantly improved the ability of phosphoric acid to etch the oxidized silicon nitride structure without also attacking and degrading the oxide isolation regions.

Hydrofluoric (HF) acid has also been employed to etch oxidized silicon nitride structures. Unfortunately, the selectivity of HF acid is negative, or, in other words, HF acid severely etches silicon oxide to the extent of removing silicon oxide at a rate faster than silicon nitride, producing unfavorable geometry for further IC device processing. When a field oxide region is present, the negative etch selectivity removes large amounts of the field oxide region, thus impairing the ability of the field oxide to act as an isolating region.

Another removal process uses HF acid in a first step and phosphoric acid in a second step to etch oxidized silicon nitride structures. See U.S. Pat. No. 3,657,030, incorporated herein by reference. The HF acid etches off enough of the oxide surface to enable the phosphoric acid to attack the silicon nitride. Too little removal by the HF acid prevents the phosphoric acid from attacking the silicon nitride, while too much removal by the HF acid unduly depletes the oxide isolation regions. Etching with HF acid followed by phosphoric acid, however, also increases the materials used—each HF and $H_3PO_4$ etching step is followed by a rinsing step, thus increasing the complexity and cost of the fabrication process.

SUMMARY OF THE INVENTION

The present invention provides a method of removing an oxidized silicon nitride layer from an IC device once it has served its purpose during fabrication. While removing the oxidized silicon nitride layer, the inventive method minimizes removal of desired isolation regions from the IC device. The method uses a two step process: one step to remove the oxidized portion of the oxidized silicon nitride layer; and a second step to remove the silicon nitride portion of the oxidized silicon nitride layer. In removing the oxidized silicon nitride layer, the method uses an acid solution exhibiting a positive etch selectivity, or ability to etch one material (i.e., silicon nitride) faster than a second material (i.e., silicon oxide).

The present invention includes a method for removing a plurality of dielectric films from a supporting substrate by providing a substrate with a second dielectric layer overlying a first dielectric layer, contacting the substrate at a first temperature with a first acid solution exhibiting a positive etch selectivity with respect to the second dielectric layer at the first temperature, and then contacting the substrate at a second temperature with a second acid solution exhibiting a positive etch selectivity with respect to the first dielectric layer at the second temperature. The first and second acid solutions preferably contain phosphoric acid. The first and second dielectric layers exhibit different etch rates in the first acid solution and the second acid solution. The first dielectric layer is preferably silicon nitride and the second dielectric layer is preferably silicon oxide. The second temperature is preferably lower than the first temperature.

The present invention yields several advantages over the prior art. One advantage is that the etch selectivity for silicon oxide-silicon nitride composite structures is improved, resulting in better geometry for further IC device processing. Another advantage, at least when the same acid is used as the first and the second etchant, is that the complexity and cost of the manufacturing process decreases because less wafer processing is necessary, i.e., separate rinsing and drying steps are not required.

BRIEF DESCRIPTION OF THE SEVERAL VIEWS OF THE DRAWINGS

The present invention is illustrated in the accompanying drawings in which.

DETAILED DESCRIPTION OF THE INVENTION

The present invention provides a process for removing dielectric layers during IC and semiconductor device fabrication. In particular, the present invention includes a process for removing silicon nitride and silicon oxide layers from an IC device using a phosphoric acid solution.

The following disclosure provides specific details, such as material thicknesses and types, to thoroughly describe the present invention. The skilled artisan, however, would understand that the present invention may be practiced without employing these specific details. Indeed, the present invention can be practiced in conjunction with conventional fabrication techniques in the industry.

The process steps described below do not form a complete process flow for manufacturing IC devices. Only the process steps necessary to understand the present invention are disclosed.

Figure 1:
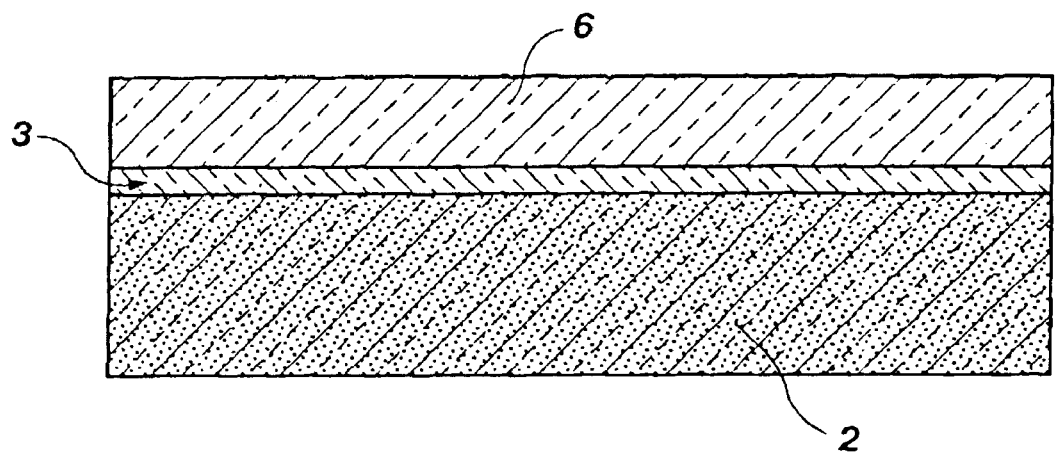
FIGS. 1–2, 3a, 3b, and 4–5 comprise cross-sectional views in a process of removing a plurality of dielectric layers from a supporting substrate according to the present invention.

As shown in FIG. 1, protecting layer 3 is first provided over substrate 2, with dielectric layer 6 provided over protecting layer 3. The substrate may be any surface suitable for IC device formation including ceramic, glass, or semiconductor wafers. The surface of the substrate may contain individual devices, such as transistors or capacitors, or intermediate layers, such as metal layers or dielectric layers. Preferably, substrate 2 comprises a silicon surface, such as a silicon wafer or bulk silicon region. Exemplary bulk silicon regions include silicon-on-insulator or silicon-on-sapphire structures.

Protecting layer 3 serves to reduce tensile stress between substrate 2 and first dielectric layer 6. Accordingly, protecting layer 3 may comprise any material exhibiting such a property, like silicon oxide. Preferably, the protecting layer is a thermal silicon oxide layer, often referred to as a "pad" oxide.

Dielectric layer 6 may be any dielectric layer used in manufacturing IC devices, such as doped or undoped silicon oxide, silicon nitride, organic dielectrics, or other electrically insulating materials, or multiple layers of these materials. Preferably, dielectric layer 6 is silicon nitride, including silicon nitride not containing a stoichiometric amount of silicon or nitrogen. The silicon nitride may optionally contain varying amounts of oxygen and/or hydrogen.

Dielectric layer 6 is deposited or otherwise formed over protecting layer 3 by any process yielding the desired physical and chemical characteristics. Processes for forming the preferred silicon nitride layer include chemical vapor deposition (CVD) processes, such as high-temperature CVD processes, plasma-enhanced CVD processes, or low pressure CVD processes, in an atmosphere with a gas or mixture of gases containing silicon and nitrogen.

Figure 2:
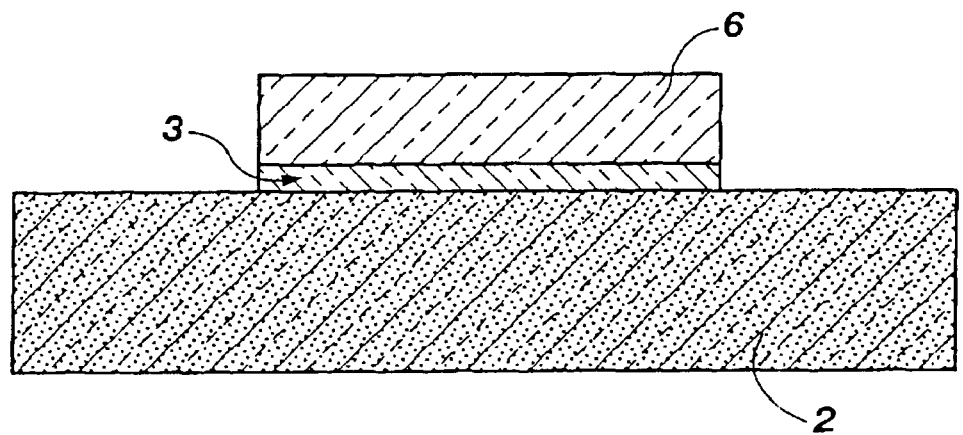

As illustrated in FIG. 2, portions of dielectric layer 6 and protecting layer 3 are next removed. The portions of these layers remaining on substrate 2 overlie active areas of the substrate, i.e., areas in which transistors and other devices will be built. Any process which removes portions of protecting layer 3 and dielectric layer 6 without degrading substrate 2 can be used. Preferably, the portions of these two layers are removed by spinning a photoresist layer on dielectric layer 6, exposing and developing the photoresist layer to expose portions of dielectric layer 6, etching the exposed portions of dielectric layer 6 and underlying portions of protecting layer 3 (if necessary, using dielectric layer 6 as a mask), and then removing any photoresist remaining on dielectric layer 6.

Figure 3A:
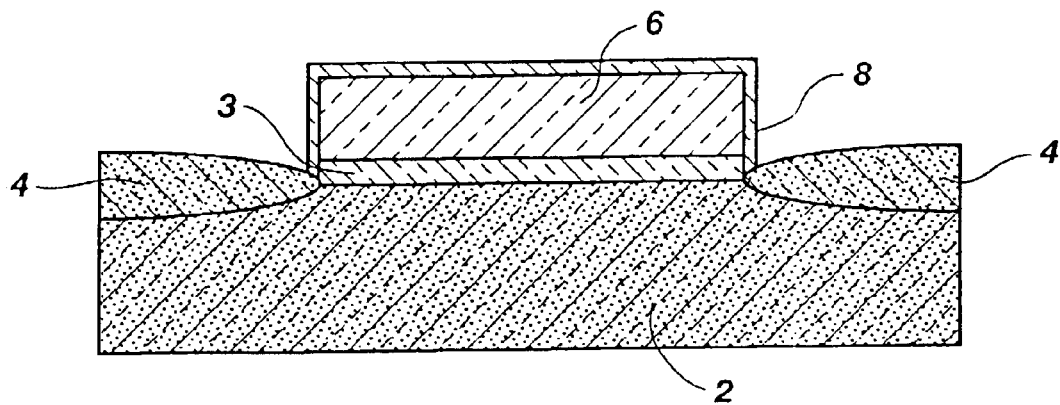

Next, as shown in FIG. 3a, isolation regions 4 are formed in substrate 2. Any process forming regions isolating the actives areas of substrate 2 can be used to form isolation regions 4, such as thermal oxidation. Exemplary isolation regions include field oxide regions and isolation regions formed by a trench and refill process. Preferably, isolation regions 4 are field oxide regions formed by thermally oxidizing substrate 2.

While substrate 2 is being thermally oxidized, dielectric layer 6 is partially oxidized, especially when dielectric layer 6 is silicon nitride, thus forming oxidized surface layer 8. Oxidized surface layer 8 will vary in thickness depending on the temperature and duration of the process forming isolation regions 4. When dielectric layer 6 is silicon nitride, the surface of oxidized surface layer 8 is essentially nitrogen-free oxide. At increased depths of oxidized surface layer 8, the oxygen content decreases and the nitrogen content increases until reaching the silicon nitride layer. Thus, a silicon oxynitride film exists between oxidized surface layer 8 and the underlying dielectric layer 6 where Si, O, and N are all present.

Oxidized surface layer 8 exhibits an etch rate different than dielectric layer 6 when exposed to the same etchant, as explained below. Preferably, oxidized surface layer 8 is a thermal silicon oxide layer, including a silicon oxide layer not containing a stoichiometric amount of silicon or oxygen. The silicon oxide may contain varying amounts of hydrogen and/or nitrogen, as explained above.

Figure 3B:
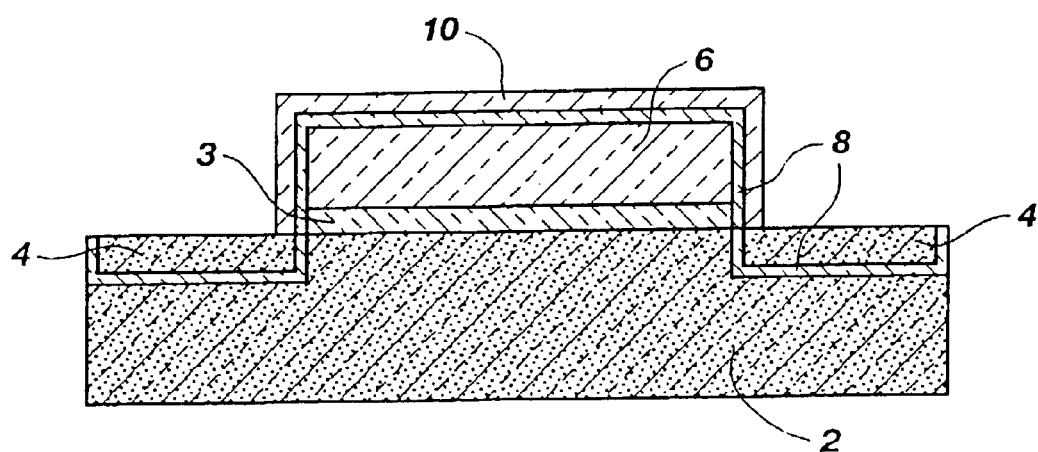

As depicted in FIG. 3b, oxidized surface layer 8 optionally has insulating layer 10 disposed thereon. When isolation regions 4 are formed by a trench and refill process, a trench is made in substrate 2 where isolation regions 4 will be formed. Prior to depositing the refill insulating material, the substrate is thermally oxidized, thus forming oxidized surface layer 8 on dielectric layer 6 and in the trench. Subsequently, insulating material for isolation regions 4 is deposited in the trench and on oxidized surface layer 8, thus forming insulating layer 10. Suitable insulating materials for these types of isolation regions include deposited silicon oxides such as BPSG oxides, silane oxides, TEOS oxides, LPTEOS oxides, PETEOS oxides, or HDPTEOS oxides, or the like.

After forming the composite structure of dielectric layer 6 and oxidized surface layer 8 (and optional insulating layer 10) on supporting substrate 2, the resulting structure is contacted with a first etchant. In one embodiment, the first etchant is an acid solution capable of removing dielectric layer 6, oxidized surface layer 8, and, when present, optional insulating layer 10. The acid solution, however, will not etch dielectric layer 6 and oxidized surface layer 8 at the same rate, but must exhibit a positive etch selectivity. A positive etch selectivity means that the acid solution etches dielectric layer 6 (e.g., silicon nitride) at a faster rate than oxidized surface layer 8. Preferably, the acid solution employed contains phosphoric acid. The acid solution may contain any concentration of phosphoric acid in water, provided the acid solution exhibits a positive etch selectivity. Preferably, the phosphoric acid concentration ranges from about 50 to about 100%, and is more preferably 85%. The phosphoric acid solution may optionally contain additional agents, such as buffering agents and/or other acids like fluoboric acid and sulfuric acid.

The first etchant, which is at a first temperature, removes insulating layer 10 (when present) and a portion of oxidized surface layer 8. The first temperature is selected so the first etchant or acid solution exhibits a positive etch selectivity. The first etchant and first temperature should be selected to obtain the highest etch rate possible without detracting from the desired positive etch selectivity. When a phosphoric acid solution is employed as the first etchant, the first temperature is greater than 165° C. and preferably should range from about 165° C. to about 220° C. More preferably, under these conditions, the first temperature is about 175° C.

Figure 4:
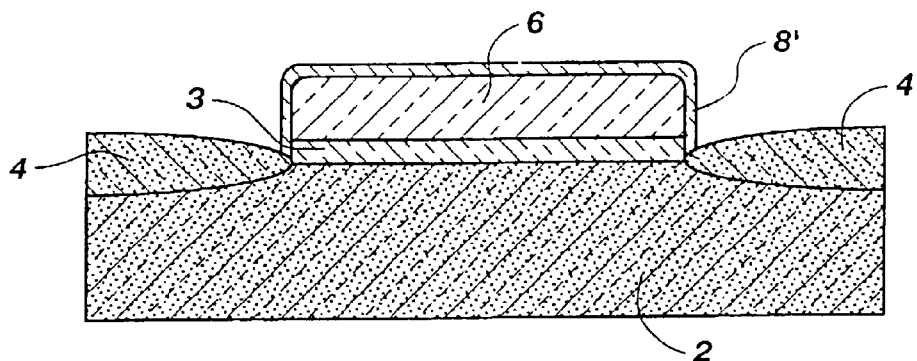
Figure 5:
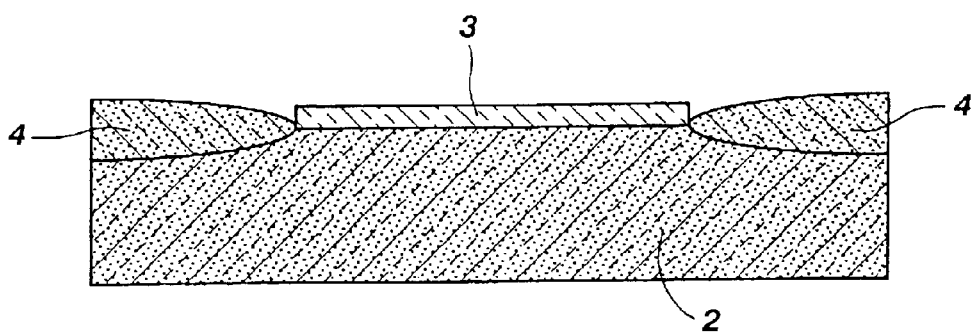

As shown in FIG. 4, after breaching the surface oxide and oxynitride portions of oxidized surface layer 8 (leaving a remaining portion 8' of oxidized surface layer as shown in FIG. 4), and preferably after removing a substantial portion of this layer, the resulting structure is contacted with a second etchant to remove a portion of dielectric layer 6. Preferably, the remaining portion of oxidized surface layer 8 and a substantial portion of dielectric layer 6 are removed. More preferably, as shown in FIG. 5, the remaining portion of oxidized surface layer 8 and substantially all of dielectric layer 6 are removed. The second etchant employed is an acid solution capable of removing both oxidized surface layer 8 and dielectric layer 6, and may be the same or different than the first etchant. The acid solution employed as the second etchant must also exhibit a positive etch selectivity. Preferably, the acid solution employed contains phosphoric acid. The acid solution may contain any concentration of phosphoric acid in water, provided the acid solution exhibits a positive etch selectivity. Preferably, the phosphoric acid concentration ranges from about 50% to about 100%, and is more preferably 85%. The phosphoric acid solution may contain additional agents, such as buffering agents and other acids like fluoboric acid and sulfuric acid.

The second etchant is held at a second temperature. The second temperature is selected so that the second etchant or acid solution exhibits a positive etch selectivity. The second etchant and second temperature should be selected to obtain the highest etch rate possible without detracting from the desired positive etch selectivity. When a phosphoric acid solution etch is employed as the second etchant, the second temperature is lower than the first temperature. The second temperature is less than 165° C., and preferably ranges from about 145° C. to about 165° C. More preferably, under these conditions, the second temperature is about 155° C.

Figure 6:
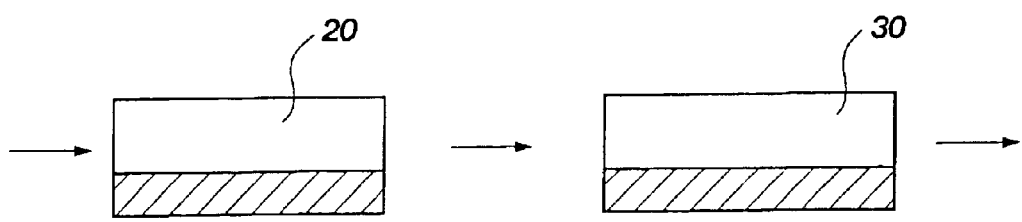
FIG. 6 comprises a cross-sectional view of an apparatus used in removing a plurality of dielectric layers from a supporting substrate according to the present invention.

The above process may be performed in any apparatus capable of maintaining the operating conditions described above, such as the apparatus illustrated in FIG. 6. In one embodiment, the first and second removal steps performed by the first and second etchants can be performed in separate chambers. In this embodiment, the first removal step could be performed at the first temperature in a first chamber (or bath) 20. The second removal process could then be performed in a second bath or chamber 30 maintained at the second temperature. In another embodiment, where the same acid solution is used as both the first and second etchant, the process of the present invention can be performed in the same chamber 20. In this embodiment, the first removal process can be performed in chamber 20 at a first temperature. After the first removal process is complete, the temperature in chamber 20 can be lowered and the second removal process performed without moving the substrate into chamber 30. However, when both removal steps are performed in the same chamber, contaminants remaining from the first removal process can hinder the second removal process. Accordingly, the first and second removal steps are preferably carried out in separate chambers.

The present invention can be illustrated by the following Example, which should not be viewed as limiting the present invention in any manner.

EXAMPLE

The preferred inventive method of using phosphoric acid at a first, higher temperature in a first step and then at a second, lower temperature in a second step was compared with using a conventional method of using HF acid in a first step and then using phosphoric acid in a second step. In both instances, after forming a thin pad oxide layer on a silicon substrate, a silicon nitride layer was deposited on the pad oxide layer. The silicon nitride and pad oxide layers were then patterned and etched. Field oxide regions with a thickness of 2200 angstroms were then formed by thermal oxidation in the substrate, also thermally oxidizing the silicon nitride layer.

The oxidized surface layer and underlying silicon nitride layer were then removed. Using the conventional HF acid in a first step and phosphoric acid in a second step to remove the oxidized surface layer and underlying silicon nitride layer resulted in about 240–260 angstroms of the field oxide regions also being removed. However, using the inventive method of phosphoric acid at 175° C. in a first step and then phosphoric acid at 155° C. in a second step to remove the oxidized surface layer and underlying silicon nitride layer resulted in a field oxide loss of less than 80 angstroms.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A method for removing, from a semiconductor substrate, a silicon oxide gradient layer, the method comprising:
   providing a substrate bearing:
      a dielectric layer comprising a silicon oxide gradient sublayer having a maximum oxygen atom concentration at a surface thereof, the oxygen atom concentration decreasing monotonically to substantially zero with distance of material in the dielectric layer from an active surface of the substrate, the balance of the dielectric layer comprising silicon nitride;
   contacting the surface with an acid solution comprising phosphoric acid at a first temperature, the acid solution at the first temperature exhibiting a positive etch selectivity for silicon oxide over silicon nitride; and
   gradually lowering a temperature of the acid solution to a second temperature, the acid solution at the second temperature exhibiting a positive etch selectivity for silicon nitride over a material of an adjacent layer or structure.

2. The method according to claim 1, wherein the providing the substrate comprises providing a substrate with the dielectric layer comprising an exposed insulating layer.

3. The method according to claim 2, wherein the providing the substrate comprises providing the substrate with the exposed insulating layer comprising at least one of a BPSG oxide, a silane oxide, a TEOS oxide, an LPTEOS oxide, a PETEOS oxide, and an HDPTEOS oxide.

4. The method according to claim 1, wherein the providing the substrate comprises providing a substrate with a pad oxide layer beneath at least a portion of the dielectric layer.

5. The method according to claim 1, wherein the contacting is effected with the first temperature being greater than about 165° C.

6. The method according to claim 1, wherein the contacting is effected with the first temperature being about 165° C. to about 220° C.

7. The method according to claim 1, wherein the contacting is effected with the first temperature being about 175° C.

8. The method according to claim 1, wherein the contacting is effected with the second temperature being less than about 165° C.

9. The method according to claim 1, wherein the contacting is effected with the second temperature being about 145° C. to about 165° C.

10. The method according to claim 1, wherein the contacting is effected with the second temperature being about 155° C.

11. The method according to claim 1, wherein the contacting comprises contacting the dielectric layer with at least one acid solution having a concentration of from about 50% to about 100% phosphoric acid.

12. A method for forming, from a silicon substrate, a semiconductor device bearing at least one isolation area and at least one active area, comprising:

providing a substrate;

forming a layer comprising silicon nitride on a region of the substrate where the at least one active area is to be located;

forming an oxide on at least an uppermost surface of at least one region of the substrate exposed laterally beyond the layer to form the at least one isolation area, silicon underlying the layer remaining substantially unoxidized;

contacting surfaces of the at least one isolation area and the layer with an acid solution comprising phosphoric acid at a first temperature, the acid solution at the first temperature exhibiting a positive etch selectivity for silicon oxide over silicon nitride; and gradually lowering a temperature of the acid solution to a second temperature, the acid solution at the second temperature exhibiting a positive etch selectivity for silicon nitride over at least one material of an adjacent layer or structure.

13. The method according to claim 12, wherein the forming the oxide comprises thermally oxidizing the at least one region of the substrate.

14. The method according to claim 12, wherein the forming the oxide comprises forming at least one of a BPSG oxide, a silane oxide, a TEOS oxide, an LPTEOS oxide, a PETEOS oxide, and an HDPTEOS oxide.

15. The method according to claim 12, wherein the forming the layer comprises forming the layer by a thermal nitridation technique.

16. The method according to claim 12, wherein the fanning the layer comprises fanning a layer comprising at least one of a CVD nitride, an HTCVD nitride, a PECVD nitride, and an LPCVD nitride.

17. The method according to claim 12, further comprising forming a pad oxide prior to the forming the layer, the layer substantially covering the pad oxide.

18. The method according to claim 12, wherein the contacting is effected with the first temperature being greater than about 165° C.

19. The method according to claim 12, wherein the contacting is effected with the first temperature being about 165° C. to about 220° C.

20. The method according to claim 12, wherein the contacting is effected with the first temperature being about 175° C.

21. The method according to claim 12, wherein the contacting is effected with the second temperature being less than about 165° C.

22. The method according to claim 12, wherein the contacting is effected with the second temperature being about 145° C. to about 165° C.

23. The method according to claim 12, wherein the contacting is effected with the second temperature being about 155° C.

24. The method according to claim 12, wherein the contacting comprises contacting the surface with at least one acid solution having a concentration of from about 50% to about 100% phosphoric acid.

25. The method according to claim 12, wherein the gradually lowering comprises gradually lowering the temperature of the acid solution to the second temperature to impart the acid solution with a positive etch selectivity for silicon nitride over silicon oxide.

26. The method according to claim 25, wherein the gradually lowering further comprises lowering the temperature of the acid solution to the second temperature to impart the acid solution with a positive etch selectivity for silicon nitride over silicon.

* * * * *